United States Patent
Lin et al.

(10) Patent No.: US 11,114,344 B1
(45) Date of Patent: Sep. 7, 2021

(54) IC DIE WITH DUMMY STRUCTURES

(71) Applicant: XILINX, INC., San Jose, CA (US)

(72) Inventors: Hui-Wen Lin, San Jose, CA (US); Nui Chong, San Jose, CA (US); Myongseob Kim, Pleasanton, CA (US); Henley Liu, San Jose, CA (US); Ping-Chin Yeh, San Jose, CA (US); Cheang-whang Chang, Mountain View, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/805,398

(22) Filed: Feb. 28, 2020

(51) Int. Cl.
  *H01L 21/82* (2006.01)
  *H01L 23/50* (2006.01)
  *H01L 21/768* (2006.01)
  *H01L 21/02* (2006.01)
  *H01L 21/3105* (2006.01)

(52) U.S. Cl.
  CPC ........ *H01L 21/82* (2013.01); *H01L 21/02304* (2013.01); *H01L 21/76877* (2013.01); *H01L 23/50* (2013.01); *H01L 21/31051* (2013.01)

(58) Field of Classification Search
  CPC ......... H01L 21/02104; H01L 21/02107; H01L 21/02299; H01L 21/02304; H01L 21/02365; H01L 21/02436; H01L 21/02439; H01L 21/02518; H01L 21/02697; H01L 21/31; H01L 21/31051; H01L 21/31053; H01L 21/768; H01L 21/76838; H01L 21/76877; H01L 21/77; H01L 21/82; H01L 21/822; H01L 23/48; H01L 23/50; H01L 23/52; H01L 23/522; H01L 23/5226; H01L 27/0203; H01L 27/0207
  See application file for complete search history.

(56) References Cited

U.S. PATENT DOCUMENTS

2009/0155990 A1* 6/2009 Yanagidaira ...... H01L 21/76877
                                                        438/584

OTHER PUBLICATIONS

Yoon Myung Sub, et al., "The study on the effect of pattern density distribution on the STI CMP process", AIP Conference Proceedings 1875, 030023 (2017) 8 pages.

* cited by examiner

*Primary Examiner* — Cheung Lee
(74) *Attorney, Agent, or Firm* — Patterson + Sheridan, LLP (57) ABSTRACT

Integrated circuit (IC) dies and method for manufacturing the same are described herein that mitigate pattern loading effects during manufacture. In one example, the IC includes a die body having a first circuit block separated from an adjacent second circuit block by a buffer zone. The first and second circuit blocks have first and second transistors that are at least partially fabricated from a gate metal layer and disposed immediately adjacent the buffer zone. A dummy structure is formed in the buffer zone and is also at least partially fabricated from the gate metal layer. An amount of gate metal layer material in the dummy structure is selected to mitigate differences in the amount of gate metal layer material in regions of first and second circuit blocks that neighbor each other across the buffer zone.

20 Claims, 5 Drawing Sheets

IC DIE WITH DUMMY STRUCTURES

TECHNICAL FIELD

Examples of the present disclosure generally relate to semiconductor devices and, in particular, integrated circuit (IC) dies having dummy structures disposed between circuit blocks to enhance planarization during IC die fabrication.

BACKGROUND

Electronic devices, such as tablets, computers, copiers, digital cameras, smart phones, control systems and automated teller machines, among others, often employ electronic components which include integrated circuit (IC) dies for logic processing and memory, among other functions. As well known, the drive for increased functionality, higher component density and less power consumption has driven an ever increasing miniaturization of the circuit elements within the IC die, such as line size and density, transistor size and density, and the like. This miniaturization of the circuit elements within the IC die has led to a host of engineering challenges that must be overcome to ensure robust performance, reliability, and manufacturability of next generation IC dies.

Once such challenge is maintaining good planarization during chemical mechanical polishing (CMP) processes during the fabrication of the circuit elements that are part of the IC die. CMP is performed on a wafer prior to dicing. CMP generally utilizes a combination of mechanical force and chemical activity to remove a portion of a material layer deposited during IC fabrication to produce a very planar surface. The planar surface is needed to reduce lithographic errors in subsequently deposited layers, and produce circuitry that performs as intended. CMP results are sensitive a wide array of factors, including the materials being polished, pad types, slurries, device density and the like. As design rules change as spacing nodes decrease, CMP techniques and/or the structures being polished have to correspondingly evolve in order to achieve acceptable planarization results.

SUMMARY

Integrated circuit (IC) dies and methods for fabricating the same are described herein that mitigate pattern loading effects during manufacture. In one example, the IC includes a die body having a first circuit block separated from an adjacent second circuit block by a buffer zone. The first and second circuit blocks have first and second transistors that are at least partially fabricated from a gate metal layer and disposed immediately adjacent the buffer zone. A dummy structure is formed in the buffer zone and is also at least partially fabricated from the gate metal layer. An amount of gate metal layer material in the dummy structure is selected to mitigate differences in the amount of gate metal layer material in regions of first and second circuit blocks that neighbor each other across the buffer zone.

In another example, an IC die is provided that includes a die body having a first circuit block separated from an adjacent circuit block by a buffer zone. The buffer zone is free of active circuit devices that are part of either of the adjacent first and second circuit blocks. The first circuit block has a first circuit block one (CB1) region adjacent the buffer zone. The first circuit block has at least one transistor that is at least partially fabricated from a gate metal layer. The first CB1 region has a first gate metal per unit area (GMPUA). The second circuit block has a first circuit block two (CB2) region disposed directly across the buffer zone from the first CB1 region. The first CB2 region has at least one transistor that is at least partially fabricated from the gate metal layer. The first CB2 region has a second GMPUA. The first GMPUA is greater than the second GMPUA. A first dummy structure is formed in a first buffer region of the buffer zone that extends from the first CB1 region to the first CB2 region. The first dummy structure is at least partially fabricated from the gate metal layer. The first buffer region has a third GMPUA. The first GMPUA is greater than or equal to the third GMPUA, and the third GMPUA is greater than or equal to the second GMPUA.

In another example, and an integrated circuit (IC) die is provided that includes a die body having a first circuit block separated from an adjacent circuit block by a buffer zone. The buffer zone is free of active circuit devices that are part of either of the adjacent first and second circuit blocks. The first circuit block has a first circuit block one (CB1) region adjacent the buffer zone having a first CB1 transistor that is at least partially fabricated from a gate metal layer. The second circuit block has a first circuit block two (CB2) region disposed directly across the buffer zone from the first CB1 region. The first CB2 region has a first CB2 transistor that is at least partially fabricated from the gate metal layer. The first CB1 transistor is disposed adjacent the first CB2 transistor across the buffer zone. A first dummy structure and an adjacent second dummy structure are formed in a first buffer region of the buffer zone. The first and second dummy structures are generally aligned between the first CB1 transistor and the first CB2 transistor. The first dummy structure comprises a first amount of the gate metal layer that is greater than a second amount of the gate metal layer that comprises the second dummy structure.

In another example, a method for manufacturing an integrated circuit (IC) die is disclosed. The method includes depositing a metal gate layer on a substrate, wherein the metal gate layer has a first thickness in a transistor structure disposed in a first circuit block, a second thickness in a transistor structure disposed in a second circuit block, a third thickness in a first dummy structure disposed in a buffer zone separating the first circuit block from the second circuit block, and a fourth thickness in a second dummy structure disposed in the buffer zone separating the first circuit block from the second circuit block. At least in the transistor structures disposed in the first and second circuit blocks, the metal gate layer is over a high-K dielectric gate oxide layer. The method also include planarizing the metal gate layer, such that after planarization, the third thickness is greater than the fourth thickness. The method also includes dicing the substrate for form a plurality of dies, one of which including the first circuit block, the buffer zone and the second circuit block.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. An aspect or an advantage described in conjunction with a particular example is not necessarily limited to that example and can be practiced in any other examples even if not so illustrated or if not so explicitly described.

DETAILED DESCRIPTION

Integrated circuit (IC) dies and methods for fabricating the same are described herein which mitigates pattern loading effects during manufacture. Pattern loading effects generally pertain to the tendency of a material layer being planarized during a chemical mechanical planarization (CMP) process to dish in response to differing pattern densities (i.e., distribution density of transistor and/or other circuit elements) and/or the composition variation between elements comprising adjacent circuit elements. Particularly, selecting density and/or composition of dummy structures present in a buffer zone separating adjacent circuit blocks within an IC die substantially inhibits dishing during CMP of a gate metal layer during die fabrication, resulting in a reliably planar post-CMP gate metal layer, increase process control, and ultimately, better performing and more reliable electrical functionality of the IC die. Control of the density and/or composition variation in dummy structures is realized by modulating the amount of gate metal layer material present in the dummy structures and/or across the buffer zone in response to the composition and/or pattern density of the transistors bordering the buffer zone of adjacent circuit blocks.

In one example, an IC die includes a die body having a first circuit block separated from an adjacent second circuit block by a buffer zone. The first and second circuit blocks have first and second transistors that are at least partially fabricated from a gate metal layer and disposed immediately adjacent the buffer zone. A dummy structure is formed in the buffer zone and is also at least partially fabricated from the gate metal layer. The dummy structure is substantially aligned with a first and second transistors of the first and second circuit blocks. An amount of gate metal layer material in the dummy structure is greater than or equal to an amount of gate metal layer material in the second transistor and less than or equal to an amount of gate metal layer material in the first transistor, wherein the amount of gate metal layer material in the first transistor is greater than that of the second transistor. In this manner, the amount of gate metal layer material in the dummy structures can be selected to provide a smooth transition of pattern density between circuit blocks across the buffer zone so that chemical mechanical polishing is much less likely to damage one of the transistors bordering the buffer zone of adjacent circuit blocks through dishing during the CMP process.

Figure 1:
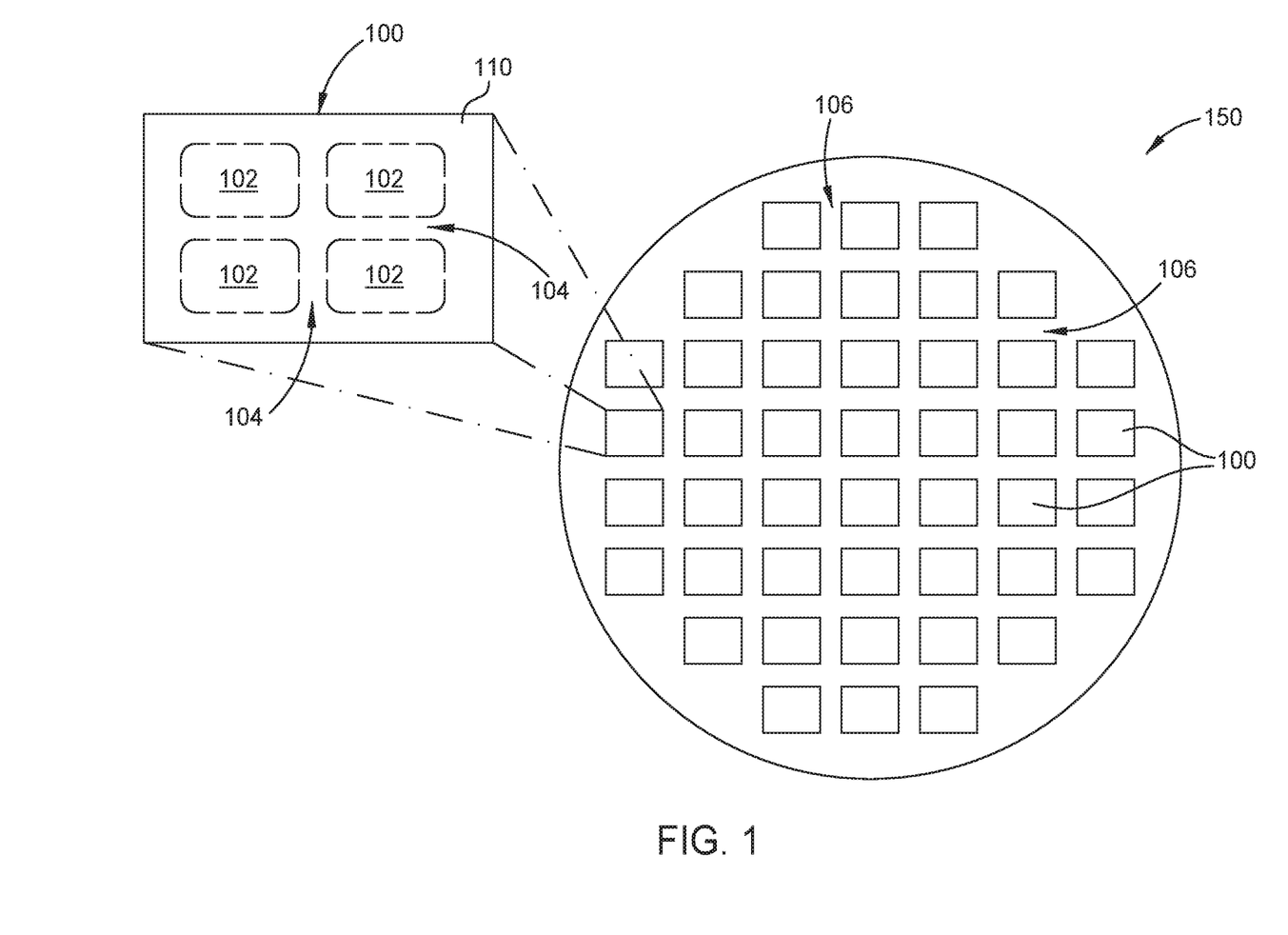
FIG. 1 is a top view of a wafer having a plurality of integrated circuit (IC) dies formed thereon, one of which is enlarged to illustrate exemplary circuit blocks separated by buffer zones.

Turning now to FIG. 1, a top view of a wafer 150 having a plurality of integrated circuit (IC) dies 100 formed thereon is illustrated. One of the IC dies 100 is shown enlarged and separated (i.e., diced) into a singular die body 110 that is detached from all the other IC dies 100 formed on the wafer 150. The enlarged die body 110 illustrates exemplary circuit blocks 102 separated by buffer zones 104. The IC dies 100 are generally arranged in rows and columns separated by scribe lanes 106. The wafer 150 is sawn down the scribe lanes 106 to separate the IC dies 100 into individual monolithic integrated circuits, also known as computer chips, for example, as shown in the enlargement depicted in FIG. 1.

The IC dies 100 has functional circuitry configured to perform logic, memory, sensing or other function, and may include analog and/or digital circuits. For example, the functional circuitry of the IC dies 100 may be configured as at least one of, but not limited to, a sensor, application-specific integrated circuit (ASIC), a processor, programmable logic device (such as field programmable gate array (FPGA)), a memory device, or an optical device, among others. One or more of the IC dies 100 may optionally include optical devices such as photo-detectors, lasers, optical sources, and the like.

The functional circuitry of the IC die 100 generally resides in the plurality of circuit blocks 102 distributed in the die body 110. Although in the example depicted in FIG. 1 only four circuit blocks 102 are shown, it is to be understood that a single IC die 100 many contain as many circuit blocks 102 as space permits. The functional circuitry residing in the circuit blocks 102 generally terminates at contact pads (not shown) formed on the exterior surface of the IC die. The contact pads are utilized to connect the functional circuitry of the IC die 100 with other electronic components, such as other IC dies, interposers, package substrates, printed circuit boards and the like, typically via solder connections.

Each circuit block 102 generally includes many transistors, resistors, capacitors and interconnects (i.e., lines and via) for the electrical communication between these components. In one example, functional circuitry of the circuit blocks 102 include logical function generators such as look up tables (LUTs), storage elements, distributed memory and shift register logic (SRL), and multiplexers, and carry logic. The storage elements may include a description of and controls for latches and flip-flops. The functional circuitry of the circuit blocks 102 may also include a large number of different programmable tiles including at least one or more of multi-gigabit transceivers ("MGTs"), configurable logic elements ("CLEs"), random access memory blocks ("BRAMs"), input/output blocks ("IOBs"), configuration and clocking logic ("CONFIG/CLOCKS"), digital signal processing blocks ("DSPs"), specialized input/output blocks ("I/O") (e.g., configuration ports and clock ports), and other programmable logic such as digital clock managers, analog-to-digital converters, system monitoring logic, and so forth.

Some circuit blocks 102 configured as FPGAs also include dedicated processor blocks ("PROC").

Figure 2:
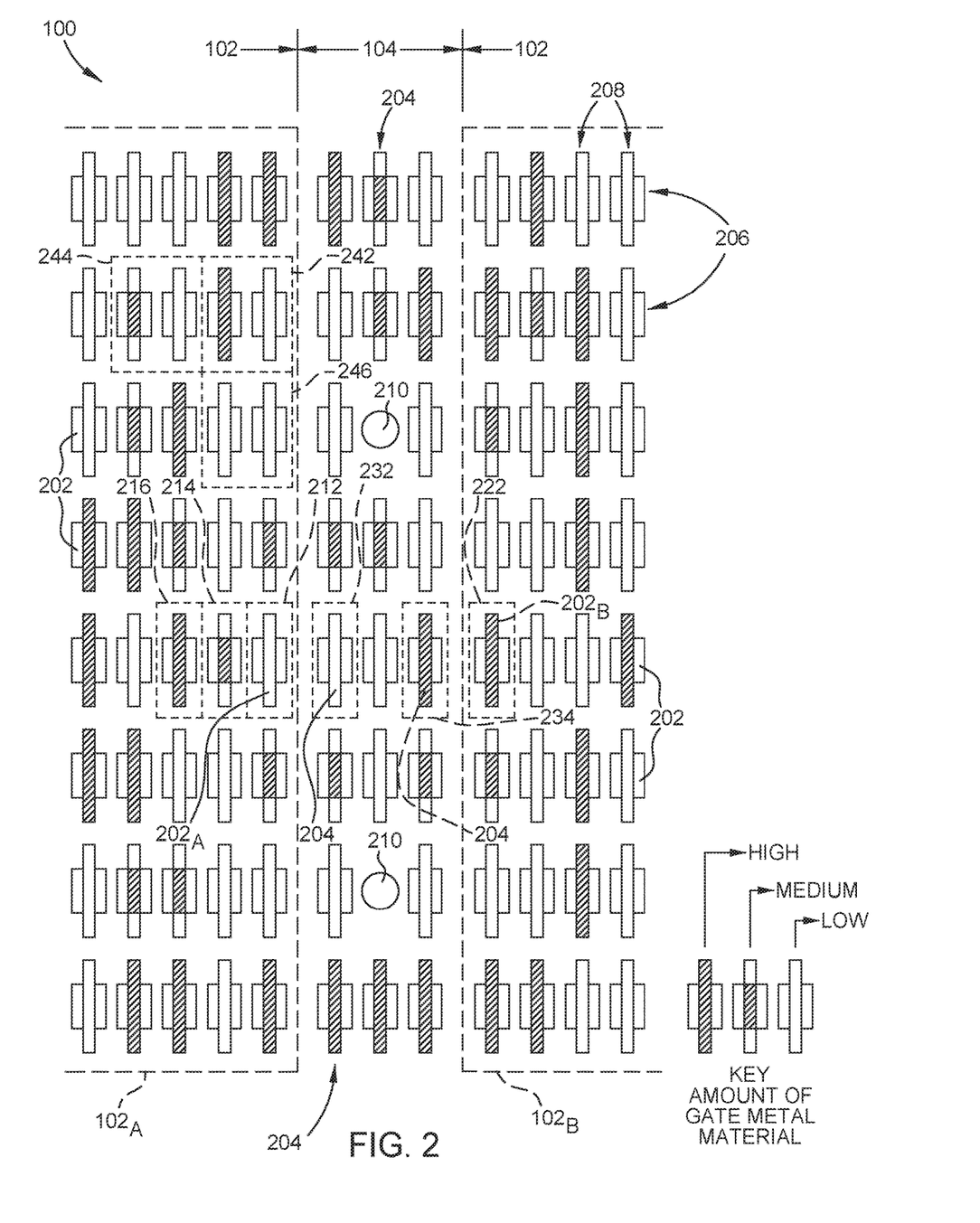
FIG. 2 is a schematic top view of a portion of the IC die illustrating transistors and dummy structures within adjacent regions of the circuit blocks and the buffer zone.

FIG. 2 is a schematic top view of a portion of the IC die 100 illustrating transistors 202 and dummy structures 204 within adjacent regions 212, 222 of the circuit blocks 102 and the buffer zone 104. In addition to separating the circuit blocks 102, the buffer zone 104 also provide space for vias 210 that provides the ground, power and data signals within the IC die 100 to functional circuitry of the circuit blocks 102. The buffer zone 104 is generally free of active circuit devices that are part of either of the adjacent first and second circuit blocks 102.

The functional circuitry of the circuit blocks 102 comprise the transistors 202, along with other active and passive circuit elements. Within each the circuit block 102, the transistors 202 are generally arranged in a plurality of rows 206 and columns 208. In the example depicted in FIG. 2, the rows 206 extend in a horizontal orientation, while the columns 208 extend in a vertical orientation. Alternatively, the rows 206 and columns 208 may have other orientations. The rows 206 of the region 212 are substantially aligned with the rows 206 of the region 222 in a horizontal orientation, such that a first transistor $202_A$ in the region 212 is substantially aligned with a first transistor $202_B$ in the region 222 directly across the buffer zone 104. Although not shown, transistors 202 in circuit blocks 102 that are vertically separated buffer zone 104 may have columns 208 that are substantially aligned in a vertical orientation.

The transistors 202 in the circuit blocks 102 have at least two different work functions. The work function controls of threshold voltage (Vt) that turns the transistor channel on and off. The work function is controlled by the selection of material and thicknesses of gate electrode and the underlying gate oxide layer. In the example depicted in FIG. 2, the transistors 202 has a metal gate layer over a high-K dielectric gate oxide layer. The transistors 202 are schematically illustrated in FIG. 2 as FinFETs, but may alternatively be configured as planar FETs.

The work function of transistors 202 is predominantly set by an amount of metal gate layer present in each transistor 202. For example and more clearly explained below with reference to FIGS. 5-7, the amount of metal gate layer present in a particular transistor 202 may be selected by controlling the thickness of the metal gate layer present in the transistor 202. The thickness of the metal gate layer may be controlled selecting the thickness of the gate oxide layer or other layer disposed between the metal gate layer and the channel region of the transistor. An exemplary arrangement of transistors 202 having different amounts of metal gate layer material, and consequently different work functions, are illustrated in FIG. 2 using solid bars of different lengths in the schematic representation of the transistors 202. Transistors 202 having a long bar have a larger amount of metal gate layer material than transistors 202 having medium length bar, and transistors 202 having medium length bar have a larger amount of metal gate layer material than transistors 202 having short length bar.

As a result of the transistors 202 having differing amounts of metal gate layer material, the first region 212 within a first circuit block $102_A$ may have a different gate metal per unit area (GMPUA) than a GMPUA of a second region 214 of the same circuit block $102_A$. An amount of metal gate layer material within a transistor $202_B$ or region 222 of another circuit block $102_B$ that is directly adjacent to the circuit block $102_A$ across the buffer zone 104 may have a GMPUA that is the same or different than the GMPUA of the transistor $202_A$ or region 212 of the circuit block $102_A$. The regions 212, 222 may be include unit areas that are as small as a single transistor 202. In one example, sequential regions 212, 214, 216 disposed in a common row 206 of the circuit block $102_A$ each are defined by a single transistor 202. Alternatively, the unit area may be defined to include a predefined number of a contiguously grouped transistors 202. As a non-limiting definition, a unit area may be defined by a number of sequential transistors 202 in a common column or in sequential columns. Thus as an example, the GMPUA of a first region 242 comprising two transistors 202 in a column closest to the buffer zone 104 may be the same or different than a GMPUA of a second region 244 comprising two transistors 202 in a column offset from the first region 242 away from the buffer zone 104, and also may be the same or different than a GMPUA of a third region 246 comprising two transistors 202 in the same column below the first region 242, as determined by the amount of gate metal layer material within each transistor within each region.

At least one or more dummy structures 204 within the buffer zone 104 is utilized to compensate for differences in the amount of gate metal layer material in regions and/or transistors residing in the circuit blocks that are disposed proximate the buffer zone 104. Since areas having more gate metal layer material polish slower than areas having less gate metal layer material, placing dummy structures in the buffer zone 104 prevents the buffer zone 104 from polishing much more rapidly than the adjacent circuit block 102, which often results in the transistors immediately adjacent the buffer zone 104 from being cover polished as further illustrated in the sequence of sectional views of a conventional IC die undergoing a CMP process as discussed below with reference to FIGS. 7-9.

Continuing to refer to FIG. 2, the amount of gate metal layer material within one or more of the dummy structures 204 is modulated within the buffer zone 104 so that the amount of gate metal layer material of the dummy structure 204 is within 10 percent of the amount of gate metal layer material of adjacent the transistor 202. Of course the amount of gate metal layer material of every adjacent dummy structure/transistor pair may not be within 10 percent, but the more dummy structure/transistor pairs that are within 10 percent will correspondingly improve CMP results compared to conventional IC dies having uniform dummy structures.

The amount of gate metal layer material present in a particular dummy structure 204 may be controlled selecting the thickness of the gate metal layer. The thickness of the gate metal layer may be controlled by controlling the thickness of the layer(s) disposed above the substrate. In one example, the dummy structure 204 is configured as a dummy transistor, and according, the thickness of the gate metal layer may be controlled by controlling the thickness of a gate oxide layer or other layer disposed between the metal gate layer and the silicon base of the wafer. An exemplary arrangement of dummy structures 204 having different amounts of metal gate layer material are illustrated in FIG. 2 using solid bars of different lengths in the same manner utilized to describe the amount of metal get layer material present in the transistors 202. The dummy structures 204 having a long bar have a larger amount of metal gate layer material than dummy structures 204 having medium length bar, and dummy structures 204 having medium length bar have a larger amount of metal gate layer material than dummy structures 204 having short length bar.

The number of dummy structures 204 disposed in substantial alignment between adjacent transistors 202 in neighboring regions 212, 222 of adjacent circuit blocks 102 may be as few as one, or be two, three, four, five or more as desired as long as space permits. As there may be more than one dummy structures 204 in substantial alignment between adjacent transistors 202 in neighboring regions 212, 222, the dummy structures 204 within the buffer zone 104 may also be grouped in buffer regions. For example, dummy structures 204 having different amounts of metal gate layer material in a first region 232 within the buffer zone 104 may have a GMPUA greater than a GMPUA of a second region 234 of the dummy structures 204 that are substantially aligned between the same transistors 202 facing across the buffer zone 104 from neighboring regions 212, 222. An amount of metal gate layer material within a dummy structure 204 or region 232 of the buffer zone 104 may have a GMPUA that is the same or different than the GMPUA of the dummy structure 204 or region 234 of the dummy structures 204 that are substantially aligned between the same transistors 202 facing across the buffer zone 104 from neighboring regions 212, 222. The regions 232, 234 may be include unit areas that are as small as a dummy structure 204. Alternatively, the unit area may be defined to include a predefined number of a contiguously grouped dummy structures 204. In examples having more gate metal layer material in a transistor $202_A$ or region 212 in the first circuit block $102_A$ than an aligned transistor $202_B$ or region 222 in the first circuit block $102_B$, the amount of gate metal layer material in the aligned dummy structures 204 may increase, at least on average, in the dummy structures 204 closer to the first region 212.

In another example, the amount of metal gate layer material disposed in neighboring dummy structures 204 aligned in a row 206 or column 208 may increase (i.e., form a gradient of lower metal gate layer material) in a direction defined from a lower metal gate layer material transistor 202 to a higher metal gate layer material transistor 202 that face each other across the buffer zone 104 and are within the same row 206 or column 208 as the neighboring dummy structures 204. Examples of such an arrangement is illustrated in the dummy structures 204 comprising the 1-2 and 4-5 rows 206 from the top of the portion of the IC die 100 illustrated in FIG. 2.

Figure 3:
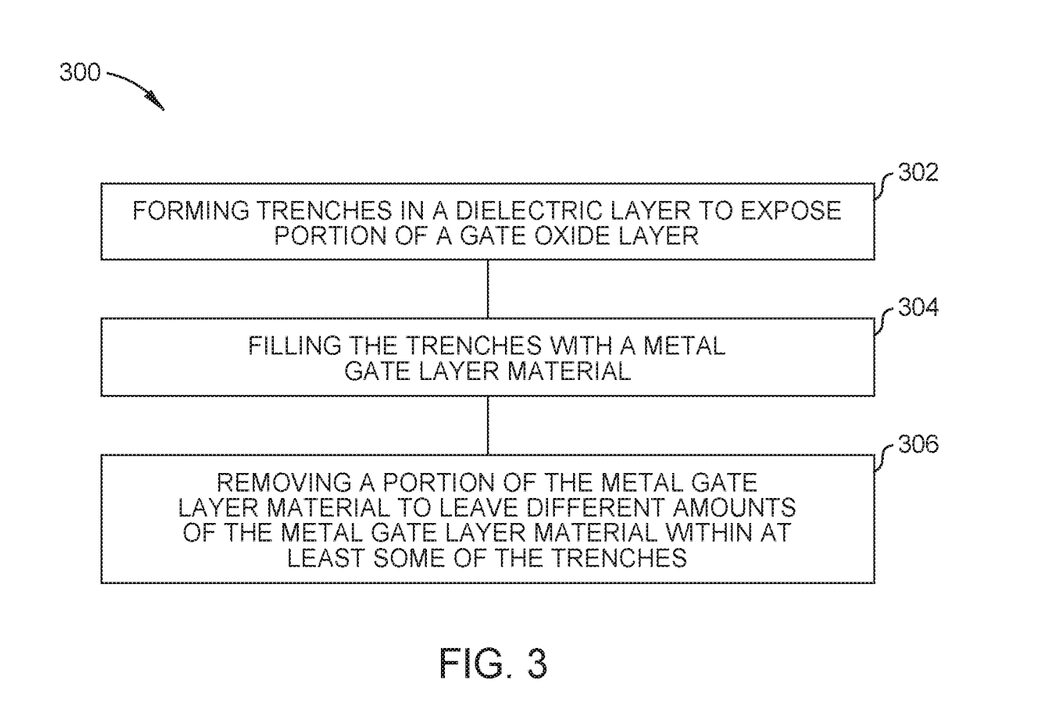
FIG. 3 is a flow diagram depicting one example of a method for fabricating an IC die.
Figure 4:
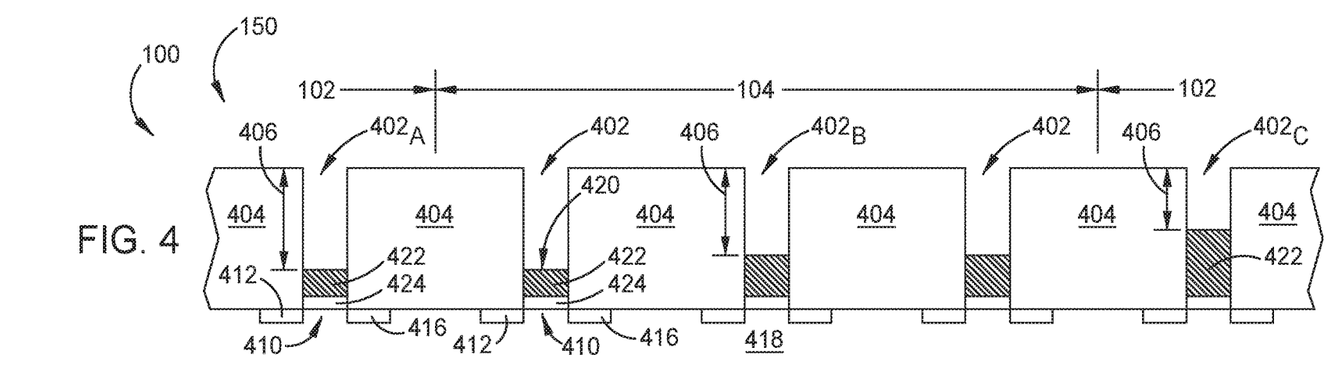
FIGS. 4-6 are a partial sectional views of a wafer illustrating transistors and dummy structures of an IC die during different stages of fabrication.
Figure 5:
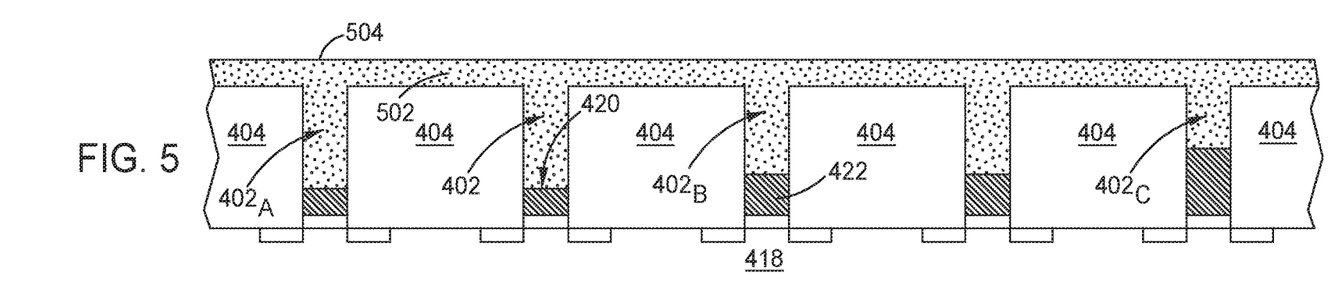
Figure 6:
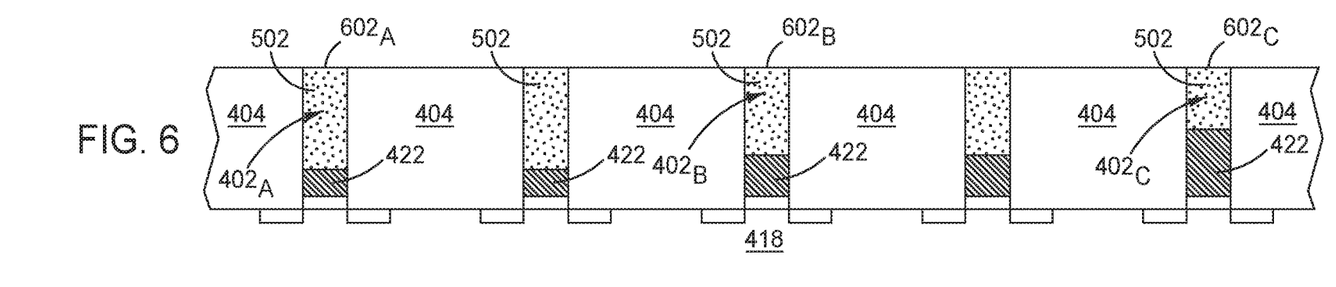

FIG. 3 is a flow diagram depicting one example of a method 300 for fabricating an IC die 100. FIGS. 4-6 are a partial sectional views of a wafer 150 illustrating transistors 202 and dummy structures 204 of the IC die 100 during different stages of fabrication according to the method 300. The IC die 100 may also be fabricated utilizing methods different than the exemplary method 300 described below. Additionally, although the structures illustrated in FIGS. 4-6 depict planar FETs, the method 300 may be adapted for form FinFETs as well.

The method 300 begins at operation 302 by forming a trench 402 in a dielectric layer 404, as shown in FIG. 4. The dielectric layer 404 may be silicon dioxide ($SiO_2$) or other suitable material. The trench 402 is generally aligned with a channel 410 defined between a source 412 and a drain 416 formed in a substrate 418. The substrate 418 is the silicon portion of the wafer 150. The trench 402 may be formed by any suitable manner, for example, by pattern etching. A bottom 420 of the trench 402 is defined by an exposed portion of a gate oxide layer 422 above the channel 410. The gate oxide layer 422 is fabricated from a high-K (dielectric constant) dielectric material, such as hafnium dioxide ($HfO2$), zirconium dioxide ($ZrO2$), and titanium dioxide ($TiO2$), among other suitable dielectric materials having a dielectric constant value greater than 3.9.

A depth 406 of the trench 402 is generally dependent on the thicknesses of the layers underlying the trench 402. For example, a thickness of the gate oxide layer 422 below the trenches $402_A$ is thinner than a thickness of the gate oxide layer 422 below the trenches $402_B$, while the thickness of the gate oxide layer 422 below the trenches $402_B$ is thinner than a thickness of the gate oxide layer 422 below the trenches $402_C$. An optional oxide layer 424 may be disposed between the channel and the gate oxide layer 422. The oxide layer 424 may be silicon dioxide ($SiO_2$) or other suitable dielectric material.

As shown in FIG. 4, the depth 406 of trenches 402 in the circuitry blocks 102 proximate the neighboring trenches 402 in the adjacent buffer zone 104 have a substantially similar depth. The depth of 406 can also be modulated. Depending on the amount of metal gate material in active devices, the depth of dummy structures can be pre-designed and filled in the favorable metal gate amount to improve the following CMP uniformity.

At operation 304, the trenches $402_A$, $402_B$, $402_C$ are filled with a gate metal layer 502, as illustrated in FIG. 5. The gate metal layer 502 may be deposited by a physical vapor deposition process or other suitable process. In one example, the metal gate layer material is titanium nitride (TiN) or other suitable material. The gate metal layer 502 is deposited to depth that covers the dielectric layer 404, forming an as deposited surface 504.

At operation 306, the as deposited surface 504 of the gate metal layer 502 is removed expose the dielectric layer 404, resulting in co-planar surfaces $602_A$, $602_B$, $602_C$ of the gate metal layer 502 filling the trenches $402_A$, $402_B$, $402_C$, as illustrated in FIG. 6. The as deposited surface 504 may be removed utilizing a chemical mechanical polishing (CMP) process, or other suitable technique.

As illustrated in FIG. 6, due to the different depths of trenches $402_A$, $402_B$, $402_C$, the amount of gate metal layer 502 within the trenches 402 of the dummy structures 204 may be varied across the buffer zone 104 to substantially match the amount of metal gate layer material in the transistor 202 of the circuit blocks 102 neighboring the buffer zone 104. The modulation of the amount of metal gate layer material in the dummy structures 204 allows for pattern density effects to be reduced as compared to conventional IC dies. In this manner, the superior planarization is maintained even with transistors having different work functions in different circuit blocks 102 are located facing each other across the buffer zone 104.

In comparison, metal gate electrodes of transistors located in circuit blocks and having different work functions that facing each other across a buffer zone are prone to dishing during fabrication when dummy structures have uniform construction as found in conventional IC dies. An example of this problem is illustrated in the partial sectional views of FIGS. 7-9 depicting a wafer 750 during different stages of a conventional fabrication process.

Figure 7:
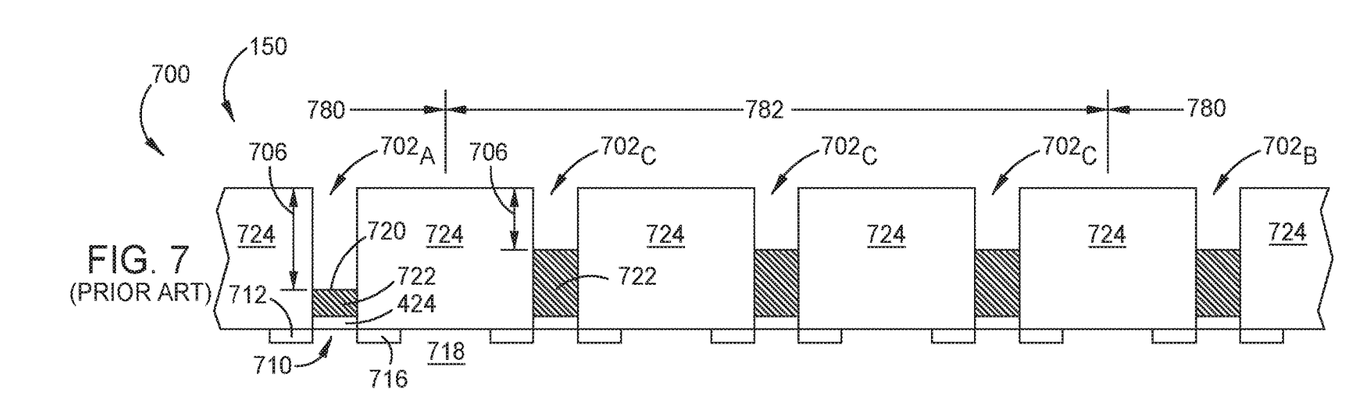
FIGS. 7-9 are a partial sectional views of a wafer illustrating transistors and dummy structures of an IC die during different stages of a convention fabrication process.
Figure 8:
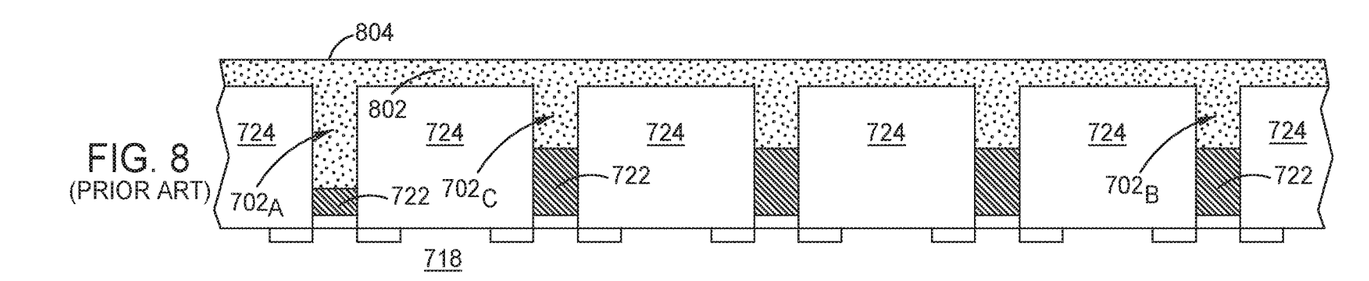
Figure 9:
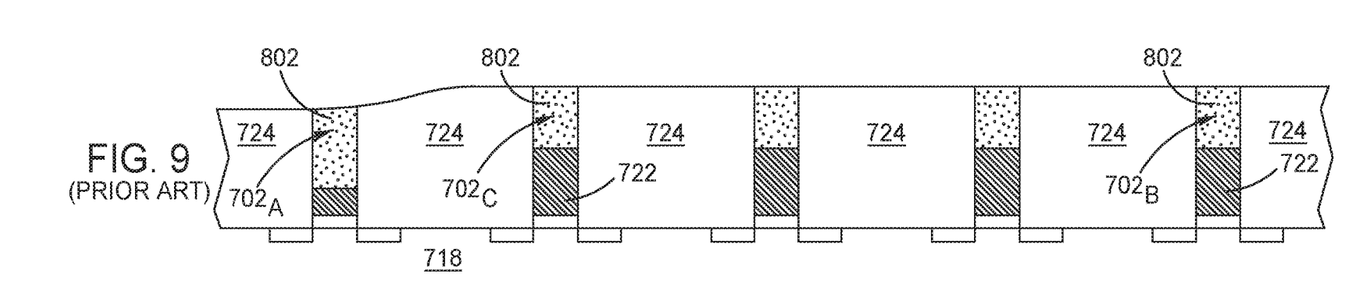

The sequence illustrated in FIGS. 7-9 generally follow the method and illustrations of FIGS. 4-6 described above, except in that the trenches of all the dummy structures within the buffer zone have a uniform depth. The uniform depth results in the same amount of gate metal layer material being present in all the dummy structures. Consequently, the amount of gate metal layer material present in the dummy structures cannot be modulated to compensate for differences in the amount of gate metal layer material in transistors facing each other across the buffer zone. This frequently requests in dishing of the gate metal of transistors disposed proximate the buffer zone during CMP processing.

Referring first to FIG. 7, a trench 702 is shown formed in a dielectric layer 724. The dielectric layer 724 may be silicon dioxide (SiO2) or other suitable material. The trench 702 is generally aligned with a channel 710 defined between a source 712 and a drain 716 that are formed in a substrate 718 of the wafer 750. A bottom 720 of the trench 702 is an exposed portion of a gate oxide layer 722 disposed above the channel 710.

A depth 706 of the trenches $702_A$, $702_B$ may vary for one or more of the transistors being formed in the circuit blocks 780 separated by buffer zones 782, similar to the transistors 202 and circuit blocks 102 described above. However, all of the trenches $702_C$ of the dummy structures have a uniform (e.g., equal) depth. By way of example and not by limitation, the depth of the trenches $702_C$ of the dummy structures may be equal, more or less than the depth of the trenches $702_A$.

As illustrated in FIG. 8, the trenches 702A, 702B, 702C are filled with a gate metal layer 802. The gate metal layer 802 is deposited to depth that covers the dielectric layer 724, forming an as deposited surface 804.

As illustrated in FIG. 9, the as deposited surface 804 of the gate metal layer 802 is removed to expose the dielectric layer 724 using a CMP process. Because the amount of the gate metal layer 802 within the trenches 702C utilized for dummy structures 204 within the buffer zone 104 is uniform, the amount of the gate metal layer 802 within the trenches 702A, 702C do not substantially match, causing the CMP process to remove more material (i.e., the dielectric layer 724 and gate metal layer gate metal layer 802) within the vicinity the adjacent trenches 702A, 702C, causing dishing at in a surface near and over the trench 702A. Consequently, the work function of the transistor fabricated using the trench 702A will not operate as designed since less gate metal material is present in the trench 702A, thus reducing the performance of the IC die containing the functional circuitry embodied within the circuit blocks 780 of the IC die 700.

Thus, integrated circuit (IC) dies and methods for manufacturing the same are described above which mitigate pattern loading effects during manufacture. Advantageously, densities and/or composition variation of dummy structures present in the buffer zones separating adjacent circuit blocks within an IC die are utilized to substantially prevent dishing during CMP of a gate metal layer during die fabrication, resulting in a reliably planar post-CMP gate metal layer, increased confidence in metal gate electrode construction, increase process control, and ultimately, a better and more reliable performing IC die.

While the foregoing is directed to specific examples, other and further examples may be devised without departing from the basic scope thereof, and the scope thereof is determined by the claims that follow.

What is claimed is:

1. An integrated circuit die comprising:
   a die body having a first circuit block separated from an adjacent second circuit block by a buffer zone, the buffer zone free of active circuit devices that are part of either of the adjacent first and second circuit blocks;
   the first circuit block having a first circuit block one (CB1) region adjacent the buffer zone having at least one transistor that is at least partially fabricated from a gate metal layer, the first CB1 region having a first gate metal per unit area (GMPUA);
   the second circuit block having a first circuit block two (CB2) region disposed directly across the buffer zone from the first CB1 region, the first CB2 region having at least one transistor that is at least partially fabricated from the gate metal layer, the first CB2 region having a second GMPUA; and
   a first dummy structure formed in a first buffer region of the buffer zone that extends from the first CB1 region to the first CB2 region, the first dummy structure at least partially fabricated from the gate metal layer, the first buffer region having a third GMPUA, wherein the first GMPUA is greater than or equal to the third GMPUA, and the third GMPUA is greater than the second GMPUA, wherein the first GMPUA is greater than the second GMPUA.

2. The integrated circuit die of claim 1, wherein a thickness of the gate metal layer comprising the first dummy structure is within 10 percent of a thickness of a transistor disposed in the first CB1 region closest the first dummy structure.

3. The integrated circuit die of claim 1, wherein a thickness of the gate metal layer comprising the first dummy structure is within 10 percent of a thickness of a transistor disposed in the first CB2 region closest the first dummy structure.

4. The integrated circuit die of claim 1, wherein a thickness of the gate metal layer comprising the first dummy structure is less than thickness of the gate metal layer comprising a transistor disposed in the first CB1 region closest to the first dummy structure, and greater than a thickness of the gate metal layer comprising a transistor disposed in the first CB2 region closest the first dummy structure.

5. The integrated circuit die of claim 1, wherein the first dummy structure is one of a plurality of dummy structures formed in the buffer zone, the plurality of dummy structures at least partially fabricated from the gate metal layer, wherein a thickness of the gate metal layer disposed in one of the plurality of dummy structures is greater than an adjacent one of the plurality of dummy structures that is closer to the first CB2 region.

6. The integrated circuit die of claim 1, wherein the third GMPUA decrease in a direction across the buffer zone defined from the first CB1 region to the first CB2 region.

7. The integrated circuit die of claim 1, wherein the first CB1 region comprises:
   a plurality of high-K metal gate transistors at least partially fabricated from the gate metal layer.

8. The integrated circuit die of claim 1 further comprising:
   a plurality of vias disposed through the buffer zone, the vias configured to transmit at least one of power, ground or signal.

9. The integrated circuit die of claim 1 further comprising:
   a second dummy structure disposed in the buffer zone adjacent the first dummy structure, the second dummy structure at least partially fabricated from the gate metal layer, the first and second dummy structures have thicknesses of the gate metal layer that are different.

10. An integrated circuit die comprising:
    a die body having a first circuit block separated from an adjacent circuit block by a buffer zone, the buffer zone free of active circuit devices that are part of either of the adjacent first and second circuit blocks;
    the first circuit block having a first circuit block one (CB1) region adjacent the buffer zone having a first CB1 transistor that is at least partially fabricated from a gate metal layer;
    the second circuit block having a first circuit block two (CB2) region disposed directly across the buffer zone from the first CB1 region, the first CB2 region having a first CB2 transistor that is at least partially fabricated from the gate metal layer, the first CB1 transistor disposed adjacent the first CB2 transistor across the buffer zone; and a first dummy structure and an adjacent second dummy structure formed in the buffer zone, the first and second dummy structures generally aligned between the first CB1 transistor and the first CB2 transistor, the first dummy structure comprising a first amount of the gate metal layer that is greater than a second amount of the gate metal layer comprising the second dummy structure.

11. The integrated circuit die of claim 10, wherein the first CB1 transistor comprises:

a third amount of the gate metal layer that is greater than or equal to the first amount of the gate metal layer comprising the first dummy structure, the first CB1 transistor disposed adjacent the first dummy structure.

12. The integrated circuit die of claim 11, wherein the second CB1 transistor comprises:

a fourth amount of the gate metal layer that is less than or equal to the second amount of the gate metal layer comprising the second dummy structure.

13. The integrated circuit die of claim 11, wherein the third amount of the gate metal layer comprising the CB1 transistor is within 10 percent of the first amount of the gate metal layer comprising the first dummy structure, the first CB1 transistor disposed adjacent the first dummy structure.

14. The integrated circuit die of claim 13, wherein a fourth amount of the gate metal layer comprising the CB2 transistor is within 10 percent of the second amount of the gate metal layer comprising the first dummy structure.

15. The integrated circuit die of claim 10 further comprising:

a third dummy structure disposed between the first dummy structure and the second dummy structure, the third dummy structure comprising third amount of the gate metal layer that is between the first and second amounts of the gate metal layer comprising the first and second dummy structures.

16. The integrated circuit die of claim 10, wherein the first CB1 transistor and the first CB2 transistors are high-K metal gate transistors.

17. The integrated circuit die of claim 10 further comprising:

a plurality of vias disposed through the buffer zone, the vias configured to transmit at least one of power, ground or signal.

18. The integrated circuit die of claim 10, wherein the first amount of the gate metal layer comprising the first dummy structure includes a gate metal thickness that is greater than a thickness of the second amount of the gate metal layer comprising the second dummy structure.

19. The integrated circuit die of claim 10, wherein:

the first CB1 transistor is disposed in a region of the first circuit block having a first gate metal per unit area (GMPUA), the first CB2 transistor is disposed in a region of the second circuit block having a second GMPUA, and the first and second dummy structures are disposed in a region of the buffer zone having a third GMPUA; and wherein the first GMPUA is greater than or equal to the third GMPUA, and the third GMPUA is greater than or equal to the second GMPUA, wherein the first GMPUA is greater than the second GMPUA.

20. A method for manufacturing an integrated circuit (IC) die, the method comprising:

depositing a metal gate layer on a substrate, the metal gate layer having a first thickness in a transistor structure disposed in a first circuit block, a second thickness in a transistor structure disposed in a second circuit block, a third thickness in a first dummy structure disposed in a buffer zone separating the first circuit block from the second circuit block, and a fourth thickness in a second dummy structure disposed in the buffer zone separating the first circuit block from the second circuit block, at least in the transistor structures disposed in the first and second circuit blocks, the metal gate layer is over a high-K dielectric gate oxide layer;

planarizing the metal gate layer leaving the third thickness greater than the fourth thickness; and dicing the substrate for form a plurality of dies, one of the dies including the first circuit block, the buffer zone and the second circuit block.

* * * * *